United States Patent [19]
Fujimoto et al.

[11] Patent Number: 5,425,833
[45] Date of Patent: Jun. 20, 1995

[54] SEMICONDUCTOR CHIP REMOVAL PROCESS AND APPARATUS

[75] Inventors: Hiroaki Fujimoto; Shinji Umeda; Shin-itsu Takehashi, all of Osaka, Japan

[73] Assignee: Matsushita Electric Industrial Co., Ltd., Osaka, Japan

[21] Appl. No.: 151,156

[22] Filed: Nov. 12, 1993

[30] Foreign Application Priority Data

Nov. 27, 1992 [JP] Japan .................. 4-318232
Jun. 8, 1993 [JP] Japan .................. 5-137611

[51] Int. Cl.⁶ .................................. B23P 19/04
[52] U.S. Cl. ......................... 156/344; 156/94; 156/584; 29/402.03; 29/762
[58] Field of Search ............... 156/344, 584, 94; 29/402.03, 762, 764; 228/191, 264

[56] References Cited

U.S. PATENT DOCUMENTS

| | | | |
|---|---|---|---|
| 4,991,286 | 2/1991 | Russo et al. | 29/840 |
| 5,164,037 | 5/1991 | Iwami et al. | 156/584 |
| 5,216,803 | 6/1993 | Nolan et al. | 29/762 X |
| 5,263,620 | 11/1993 | Hernandez et al. | 29/762 X |

FOREIGN PATENT DOCUMENTS

| | | |
|---|---|---|
| 0051165 | 5/1982 | European Pat. Off. |
| 2666451 | 3/1992 | France |
| 02025042 | 3/1990 | Japan |
| 4-262546 | 9/1992 | Japan |

OTHER PUBLICATIONS

Research Disclosure 20 Sep. 1990, Emsworth, GB p. 831, Anonymous "Rework of Chips on Flexible Circuit Boards" abstr. #31, 8047.

*Primary Examiner*—Mark A. Osele
*Attorney, Agent, or Firm*—Willian Brinks Hofer Gilson & Lione

[57] ABSTRACT

The present invention discloses a semiconductor chip removal method of removing a semiconductor chip having thereon a chip electrode from a board having thereon a board electrode wherein the semiconductor chip is bonded to the board with a resin and these chip and board electrodes are connected together electrically by a wire. This semiconductor chip removal method comprises the following steps of: (a) cutting the bonding wire into two pieces by a cutter that presses its cutting edge against the base of the bonding wire on the board electrode's side; (b) separating the semiconductor chip from the board by a chip remover that forces the semiconductor chip sideways, with the adhesive strength of the resin weakened by the application of heat thereto; and (c) removing the semiconductor chip together with a piece of the bonding wire left on the chip electrode's side.

5 Claims, 11 Drawing Sheets

Prior Art

Prior Art

SEMICONDUCTOR CHIP REMOVAL PROCESS AND APPARATUS

FIELD OF THE INVENTION

This invention pertains to a method and apparatus for removing a semiconductor chip from a board to which the chip is bonded with a resin. Particularly, the present invention finds applications in repairing certain types of semiconductor devices in which a semiconductor chip is bonded, by means of die bonding, to a board and a board electrode of the board and a chip electrode of the semiconductor chip are connected together by a boding wire.

BACKGROUND OF THE INVENTION

Figure 6A:
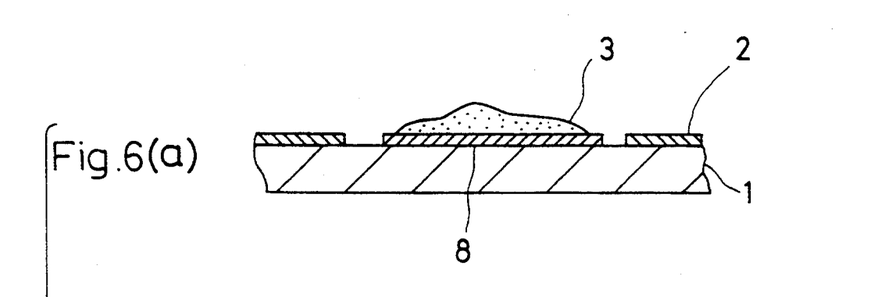
FIGS. 6a to 6d show in cross section steps of mounting a semiconductor chip onto a board by means of a conventional wire bonding technique.
Figure 6B:
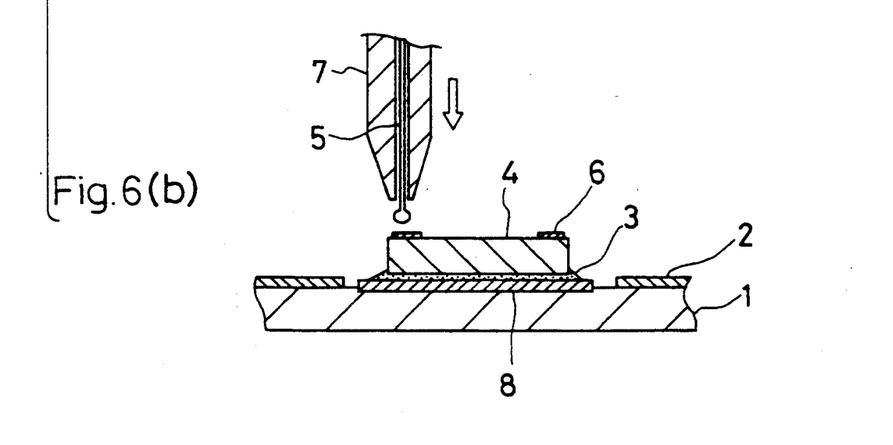
Figure 6C:
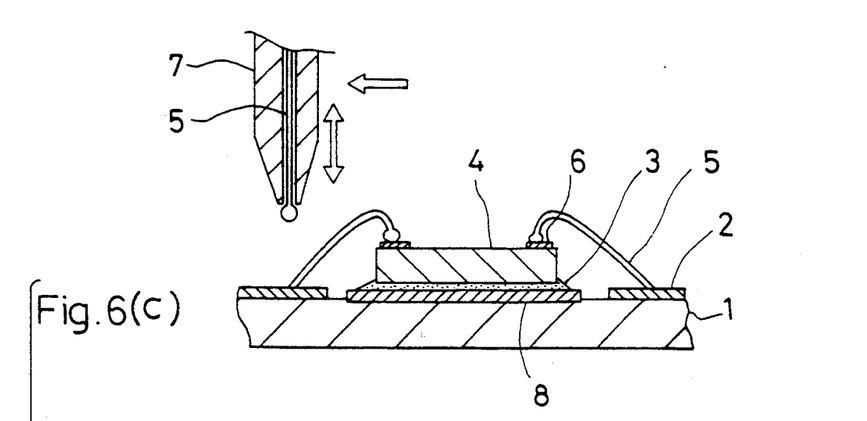
Figure 6D:
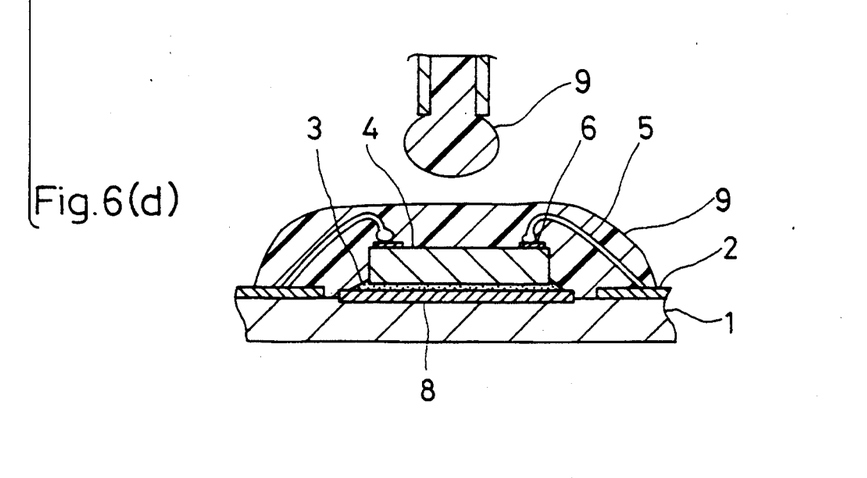
Figure 7:
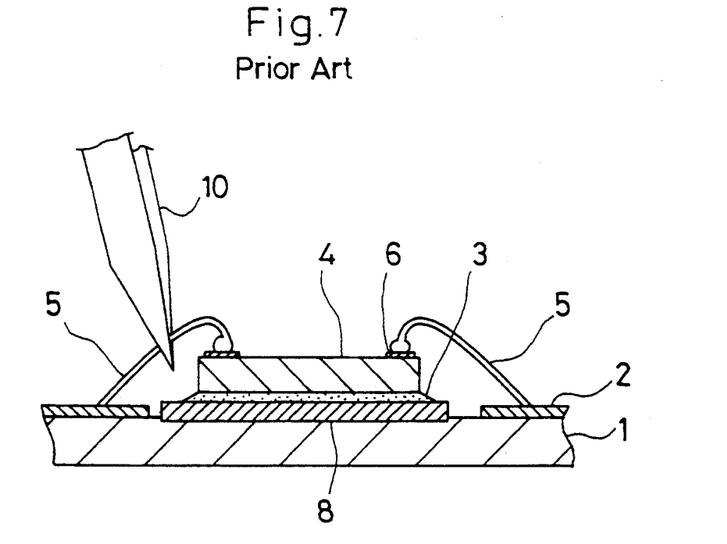
FIG. 7 shows a conventional technique for removing a semiconductor chip from a board.

Referring to FIGS. 6a to 6d, a conventional chip mounting technique of mounting a semiconductor chip onto a board is described, and a conventional chip removing technique of removing a defective semiconductor chip from a board is depicted in FIG. 7.

As shown in FIG. 6a, a die bonding resin 3 which is a thermosetting resin is applied to a die bonding pad 8 arranged on a board 1, which is a preparatory step to place a semiconductor chip 4 onto the board 1. A board electrode 2 is provided on top of the board 1.

Next, as shown in FIG. 6b, the semiconductor chip 4 is placed onto a lump of the die bonding resin 3 in such a way that the die bonding resin 3 spreads uniformly. Then, the die bonding resin 3 hardens by the application of heat, so that the semiconductor chip 4 is firmly fixed to the board 1. In the figure, a bonding wire 5, a chip electrode 6 provided on the semiconductor chip 4, and a bonding capillary 7 are shown.

Next, as shown in FIG. 6c, the chip electrode 6 and the board electrode 2 are connected together electrically by the bonding wire 5 of gold (Au) or aluminum (Al).

Finally, as shown in FIG. 6d, a molding resin 9 is applied to the semiconductor chip 4 from above by means of, for example, potting. When the molding resin 9 hardens, a finished semiconductor device is obtained.

In the above-described wire bonding technique, supersonic wave as well as load is applied to the bonding capillary 7, with one end of the bonding wire 5 and the board electrode 2 in contact. As a result, the board electrode 2 and the bonding wire 5 are interconnected. In the same way, the other end of the bonding wire 5 and the chip electrode 6 are connected together. If the bonding wire 5 is made of Au, its connection strength to each electrode is further improved by the application of heat to the connections. The diameter of the bonding wire 5 is somewhere between 20 to 35 μm. If the position of the bonding capillary 7 can automatically be determined by numerical control when connecting the bonding wire 5 and each electrode, this improves productivity.

The molding resin 9 is a resin having insulating properties (for example, an epoxy resin). The molding resin 9 preferably has a viscosity low enough to prevent the bonding wire 5 from being swept away by the flow of the molding resin 9 during the molding process, and thus possible short circuiting between the bonding wire 5 and an adjacent bonding wire is preventable. The viscosity of the molding resin 9, however, should be high enough to prevent the resin 9 from spreading too widely.

The semiconductor industry is now trying to increase the packaging density of multi-chip modules (MCM) in which many different semiconductor chips are mounted on a single board by employing a wire bonding technique in mounting semiconductor chips on a module board.

As described above, many different chips are mounted on a single board in the case of MCM, so that the final MCM yield can be expressed as the product of yields of individual semiconductor chips. This is the reason that as the number of semiconductor chips increases the MCM yield decreases.

If a defective semiconductor chip is found on a module board, this leads to loss of the entire MCM including all the other good chips. Therefore, to prevent a defective chip from causing a fatal effect on the entire MCM, defective chips must be removed from the board. Then, a good one is mounted where the detective chip was mounted by means of wire bonding.

The problem is that no conventional techniques can effectively remove defective semiconductor chips if they are mounted onto a board by means of wire bonding techniques.

Conventionally, a defective semiconductor chip is removed from a board as follows (FIG. 7). The bonding wire 5 is held by a pair of tweezers 10 or the like at around the middle, and is picked up, and is removed from the board. Next, the adhesive strength of the die bonding resin 3 is weakened and the semiconductor chip 1 is removed from the board 1.

This chip removing technique, however, produces several problems as follows:

(a) When a bonding wire is in tension, it is likely to cut easily, and thus an unwanted wire piece may be left on the board electrode 2. If this wire piece is swept away by the flow of a molding resin supplied at a later molding process, this may cause interwiring short circuiting; and (b) Since there are difficulties in automatically removing a wire from a board, this leads to poor productivity.

These problems produces further problems as follows:

(a) For the case of MCM, many different chips are mounted on a single board so that the MCM yield can be expressed as the product of yields of individual semiconductor chips. This is the reason that as the number of semiconductor chips increases the MCM yield decreases; and (d) Only a single faulty semiconductor chip can damage the entire MCM. This leads to loss of the entire MCM including a module board and all the other good semiconductor chips.

SUMMARY OF THE INVENTION

Bearing in mind the above described problems existing in the prior art techniques, the present invention was made. It is a general object of the present invention to provide an improved semiconductor chip removal method and apparatus capable of automatically removing bonding wires and of preventing the occurrence of failures such as interwiring short circuiting due to wire sweep.

The present invention disclosers a semiconductor chip removal method of removing a semiconductor chip having thereon a chip electrode from a board having thereon a board electrode wherein the semiconductor chip is bonded to the board with a resin and these chip and board electrodes are connected together electrically by a bonding wire. This semiconductor chip removal method comprises the following steps of: (a) cutting the bonding wire into two pieces by a cutter that presses its cutting edge against the base of the bonding wire on the board electrode's side; (b) separating the semiconductor chip from the board by a chip remover that forces the semiconductor chip sideways, with the adhesive strength of the resin weakened by the application of heat thereto; and (c) removing the semiconductor chip together with one of the pieces of the bonding wire left on the chip electrode's side.

Since the bonding wire is not cut apart at the middle, but at the base on the board electrode's side, this prevents wire piece from being swept away by the flow of a molding resin.

The adhesive strength of the resin is first weakened by the application of heat and the semiconductor chip is then forced sideways. This facilitates the removal of the chip from the board.

Since the chip separated from the board is removed together with a wire piece, no wire pieces will be left on the board.

The process of removing a semiconductor chip with a wire piece can be automated using machines.

It is preferable that the method further comprises a step of separating the bonding wire from the board electrode, which is carried out between the wire cutting step and the chip separating step, by forcing the cutter towards the semiconductor chip, with the cutting edge against the base of the bonding wire on the board electrode's side.

Accordingly, the bonding wire is cut off at the base on the board electrode's side.

It is preferable that the wire cutting step is a step in which the wire cutter presses its cutting edge arranged in a circle against the base of the bonding wire on the board electrode's side so as to cut the bonding wire into two pieces while one of the pieces of the bonding wire, left on the board electrode's side, is pressed by a wire pressing part of the cutter against the board electrode, and is bonded to the board electrode.

Accordingly, a wire piece left on the board electrode's side is press-welded to the board electrode and another wire piece is removed from the board along with the semiconductor chip. Therefore, failures such as interwiring short circuiting due to wire sweep caused by the flow of a molding resin are avoidable.

It is preferable that the step of heating the resin carried out at the chip separating step is a step in which the resin is heated, through the board, to a certain temperature below the heat-resistant range of the board by heating means underlying the board while at the same time the resin is heated by heat through the semiconductor chip as a result of heating the chip remover to a certain temperature above the temperature of the heating means.

Accordingly, the semiconductor chip can be removed from the board without causing any damage to the board.

It is preferable that the chip removing step is a step in which, when the chip remover having a passage for drawing vacuum in its suction surface is lowered, the suction surface is brought into face-to-face contact with the upper surface of the semiconductor chip whereby the semiconductor chip being held on the suction surface by vacuum suction is removed from the board when the chip remover is moved upward.

This facilitates the removal of the semiconductor chip from the board.

It is preferable that the wire cutting step further includes a step of shifting the cutting edge of the wire cutter to the base of the bonding wire on the board electrode's side by numerical control.

This allows the wire cutting step to be done automatically under numerical control.

It is preferable that the wire cutting step further includes a step of applying a supersonic wave to the cutting edge of the wire cutter at the time when the cutting edge is being pressed onto the base of the wire on the board electrode's side.

Accordingly, the wire piece left on the board electrode's side can be more firmly press-welded to the board electrode.

The present invention discloses an apparatus for removing a semiconductor chip having thereon a chip electrode from a board having thereon a board electrode wherein the semiconductor chip is bonded to the board with a resin and the chip and board electrodes are connected together electrically by a bonding wire. This semiconductor chip removing apparatus comprises the following elements: (a) a cutter for cutting the wire into two pieces by pressing its cutting edge against the base of the bonding wire on the board electrode's side; (b) a heater for heating the board to a temperature below the heat-resistant range of the board and for serving as a platform to support the board; and (c) a chip remover movable with respect to the board which has a chip pressing part for forcing the semiconductor chip sideways for separation and a chip holding part for holding such a separated semiconductor chip together with one of the pieces of the wire left on the chip electrode's side.

It is preferable that the wire cutter has a cutting edge arranged in a circle. This enables the wire cutter to cut a plurality of wires connected to different sides of a semiconductor chip at a time without shifting the plane position of the cutting edge.

It is preferable that a wire pressing part for press-welding the wire piece left on the board electrode's side to the board electrode is provided inside the cutting edge of the wire cutter.

It is preferable that, at the time when the cutter presses its cutting edge against the base of the bonding wire on the board electrode's side, an angle formed between the outer blade side of the cutter and the board electrode is greater than that formed between the inner blade side of the cutter and the board electrode.

As a result of such an arrangement, when the base of the bonding wire on the board electrode's side is pressed by the cutting edge against the board electrode, the bonding wire on the semiconductor chip's side is not pressed by the outer blade side of the cutter. Therefore, the wire on the semiconductor chip's side is not press-welded to the board electrode and thus the semiconductor chip and a wire piece left on the chip's side are easily removed from the board.

It is preferable that the chip remover has in the vicinity of the chip pressing part a space for accommodating therein a wire piece left on the semiconductor chip's side press-deformed by the chip pressing part.

Accordingly, even if the wire breaks when bent at the connection to the semiconductor chip, wire pieces will be safely held within the space.

It is preferable that the chip remover has its own heater capable of heating the semiconductor chip to a temperature higher than the temperature of the board reached by the foregoing heater.

It is preferable that the chip holding part of the chip remover has a passage for drawing vacuum which opens in its end facing to the upper surface of the semiconductor chip, whereby a vacuum state is created between the semiconductor chip and the end of the chip holing part.

It is preferable that the apparatus further has a means for applying supersonic to the cutter edge of the wire cutter.

PREFERRED EMBODIMENTS OF THE INVENTION

Referring to FIG 1a to 1f, a semiconductor chip removal method of the invention is described.

In the figures, the following are shown: a board 11; a board electrode 12 provided on the board 11; a bonding wire 13 which establishes electrical connection between the board 11 and a defective semiconductor chip 18A; a wire cutter 14; a heating stage 15 which underlies the board 11 for supporting it and is used to heat the board 11; a die bonding pad 16 provided on the board 11; a die bonding resin 17; a chip electrode 19 provided on the defective semiconductor chip 18A; a chip remover 20 having therein a passage 21 for drawing vacuum; a wire piece 22 left on the board electrode 12 after cutting the wire 13 (hereinafter referred to as the residual wire 22); and another wire piece 13' left on the chip electrode 12.

Figure 1A:
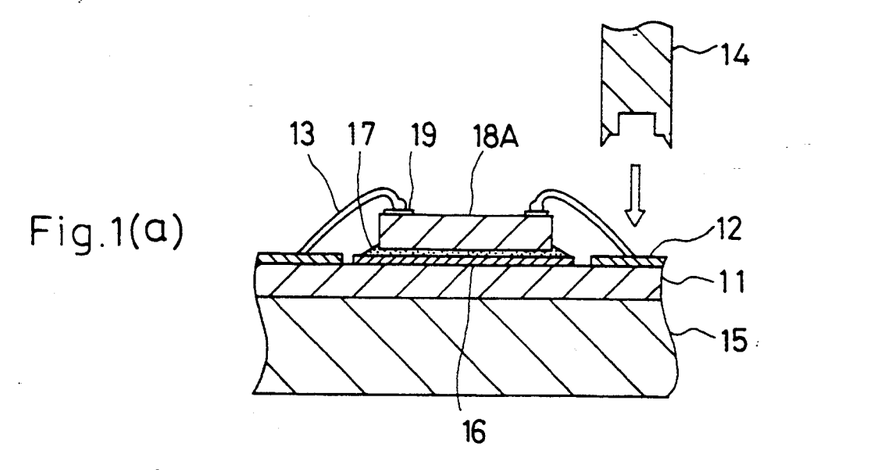
FIGS. 1a to 1f show in cross section steps of removing a semiconductor chip from a board.
Figure 1B:
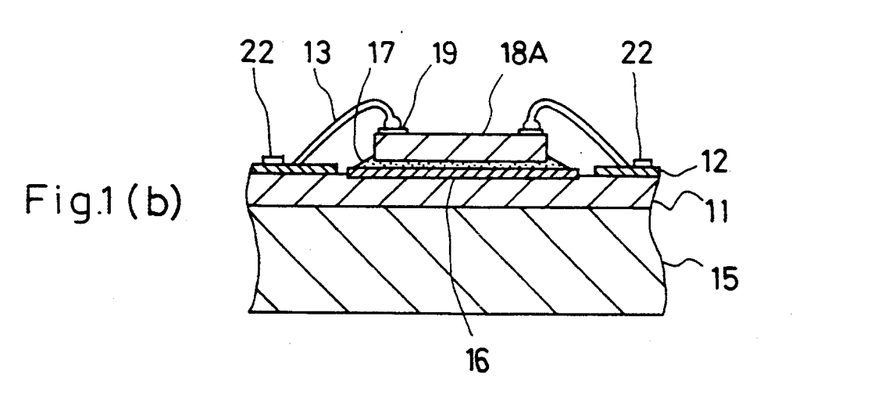

The wire cutter 14 presses its cutting edge against the base of the bonding wire 13. FIG. 1a is an illustration showing that the bonding wire 13 is about to be cut by the wire cutter 14. FIG. 1b is an illustration showing that the bonding wire 13 is cut off at the base.

The semiconductor 18A is firmly fixed to the board 11 using the die bonding resin 17 and the bonding wire 13 establishes electrical connection between the chip electrode 19 and the board electrode 12. The board 11 is a wiring board formed by, for example, ceramic or glass epoxy. The die bonding resin 17 is usually a conductive resin combined with a filler or a resin with insulating properties. The bonding wire 13, made of Al or Au, is a fine wire having a diameter somewhere between 20 and 35 μm.

Figure 1C:
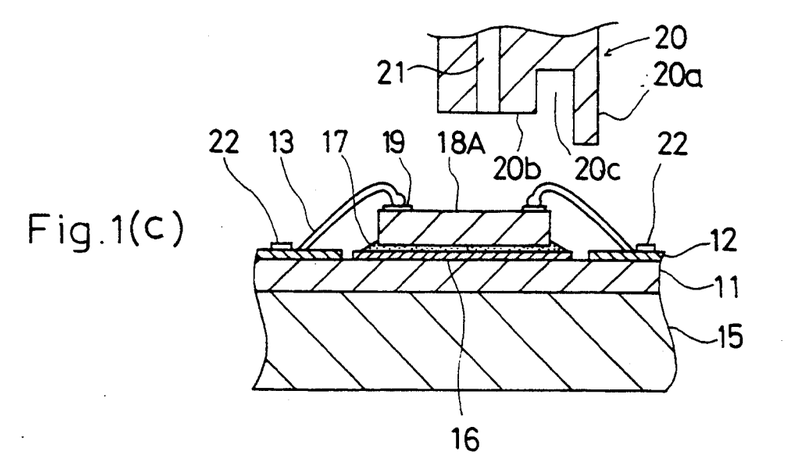
Figure 1D:
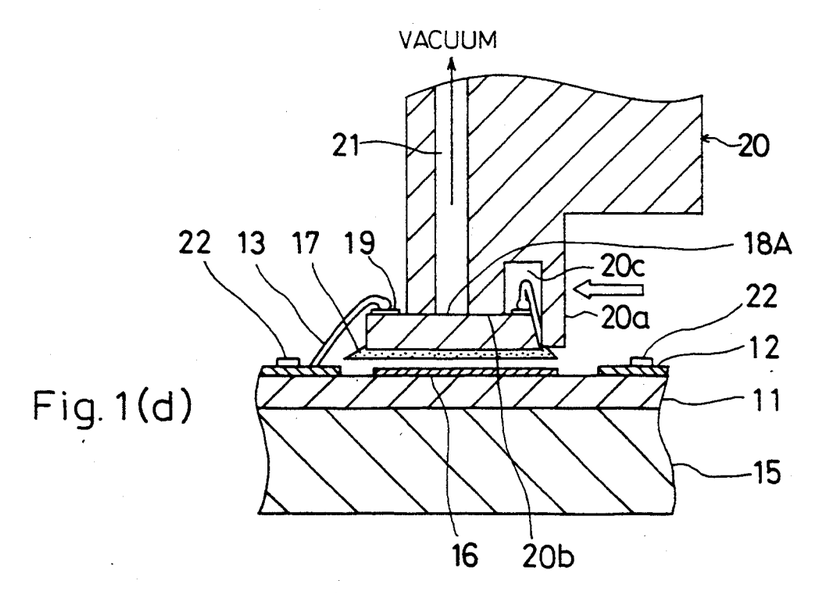

A chip separating step is shown in FIG 1c and 1d, in which the defective semiconductor chip 18A is separated from the board 11. A chip removing step is shown FIG. 1e, in which a good semiconductor chip 18B is mounted where the defective semiconductor 18A was mounted.

Figure 2A:
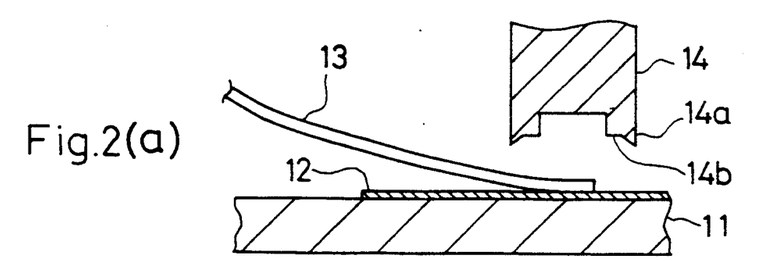
FIGS. 2a to 2c show in cross section steps of cutting a bonding wire.
Figure 2B:
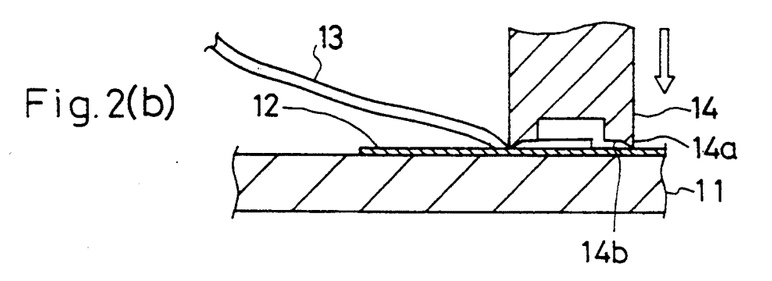
Figure 2C:
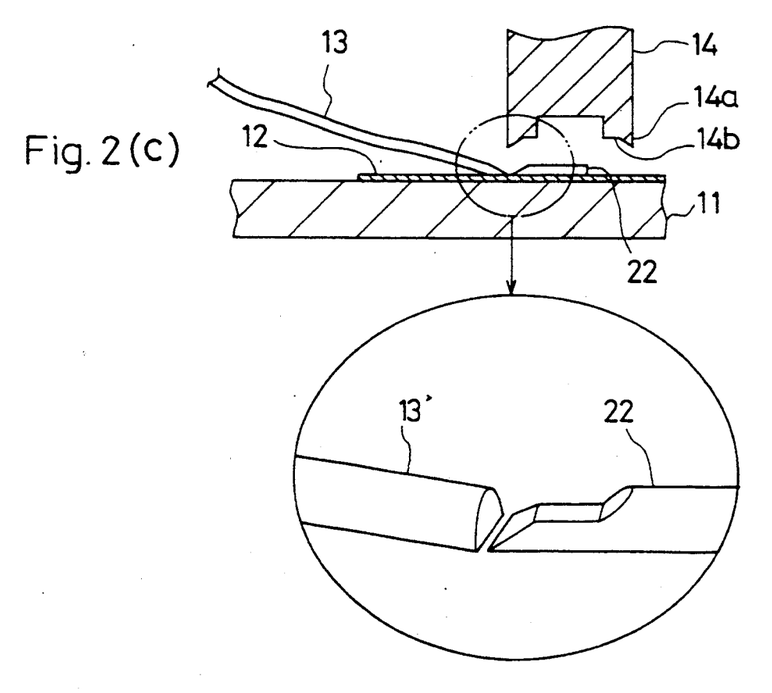

Referring now to FIGS. 2a to 2c, a wire cutting step is detailed.

As shown in FIGS. 2a and 2b, the wire cutter 14 is lowered in the direction of the bonding wire 13 to the extent that its cutting edge 14a is pressed against the base of the wire 13 on the board electrode's 12 side. Then, the wire cutter 14 is raised. The wire 13 is cut into two pieces, namely the wire 13' and the residual wire 22. A wedge-shaped space is defined between the cutting ends of the wire 13' and residual wire 22 (see FIG. 2c). Precisely, the wire 13' and the board electrode 12, or the wire 13' and the residual wire 22 are still connected together, but the connection strength between them is considerably weak. The residual wire 22 is pressed by a wire pressing part 14b of the wire cutter 14 against the board electrode 12 when the wire 13 is cut, as a result of which the residual wire 22 is fixed thereto.

Figure 3A:
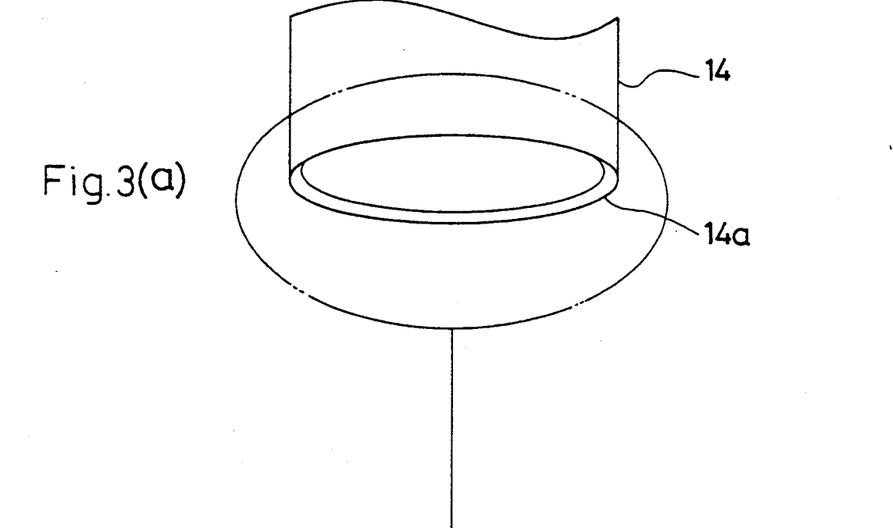
FIG. 3a is a perspective view of a wire cutter and FIG. 3b shows in cross section the same.
Figure 3B:
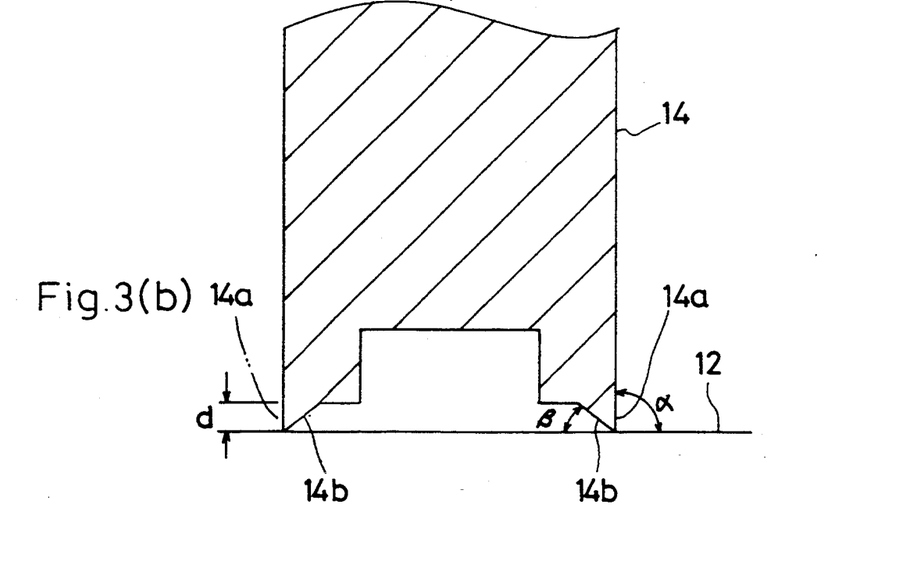

Referring to FIGS. 3a and 3b, the cutting edge 14a arranged in a circle and provided at the bottom of the wire cutter 14, is detailed. If an angle a formed between the outer blade side of the cutter 14 and the board electrode 12 is small or if the cutting edge 14a is blunt, it is likely that the wire 13', too, is pressed, by loads applied to the wire cutter 14, against the board electrode 12. As result, the wire 13' may bond to the board electrode 12. Therefore, it is preferable that the angle α is greater than 75° and that the cutting edge 14a has a thickness of not more than 10 μm.

The bonding wire 13, which is made of Au and which has a diameter of 30 μm, is originally connected to the board electrode 12 at a connection strength of above about 10 gf. When the bonding wire 13 is cut, however, the wire 13' is connected to the board electrode 12 at a weaker connection strength, about 0.3 to 3.0 gf. Therefore, the wire 13' is easily separated from the residual wire 22 as well as from the board electrode 12 when being pulled.

Provided on the inside of the cutting edge 14a is the wire pressing part 14b having a height d. The height d is smaller than the diameter of the bonding wire 13. Because of the existence of the wire pressing part 14b, the residual wire 22 is pressed against the board electrode 12 and is bonded to the electrode 12.

Further, it is preferable that supersonic wave power is applied to the wire cutter 14 so as to increase the connection strength of the residual wire 22 to the board electrode 12. The connection strength of the residual wire 22 to the board electrode 12 becomes increased compared to that of the bonding wire 13 to the electrode 12, because of an additional bonding force applied to the residual wire 22 when the bonding wire 13 is cut. This prevents the residual wire 22 from being swept away by the flow of a molding resin at a later molding step. Therefore, the presence of the residual wire 22 will not contribute to wiring failures including interwiring short circuiting.

Figure 4A:
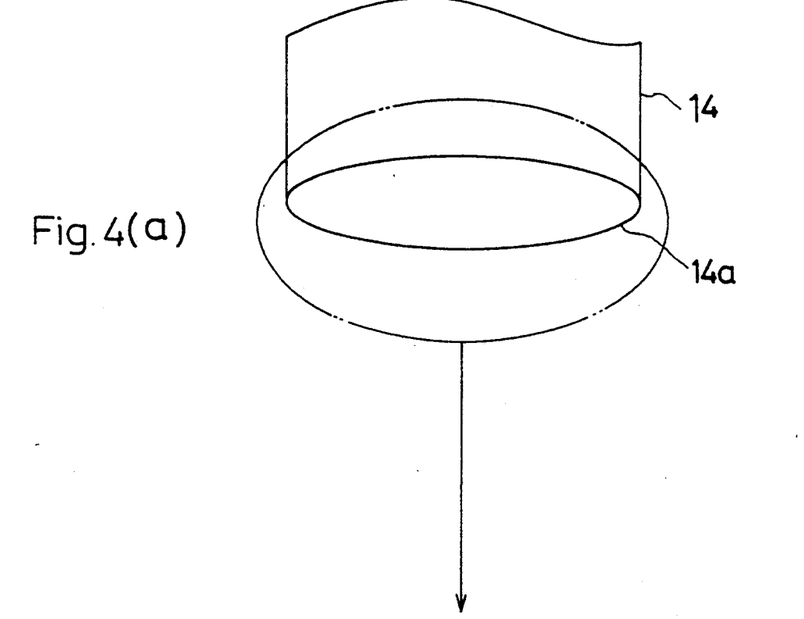
FIG. 4a is a perspective view of another cutter and FIG. 4b shows in cross section the same.
Figure 4B:
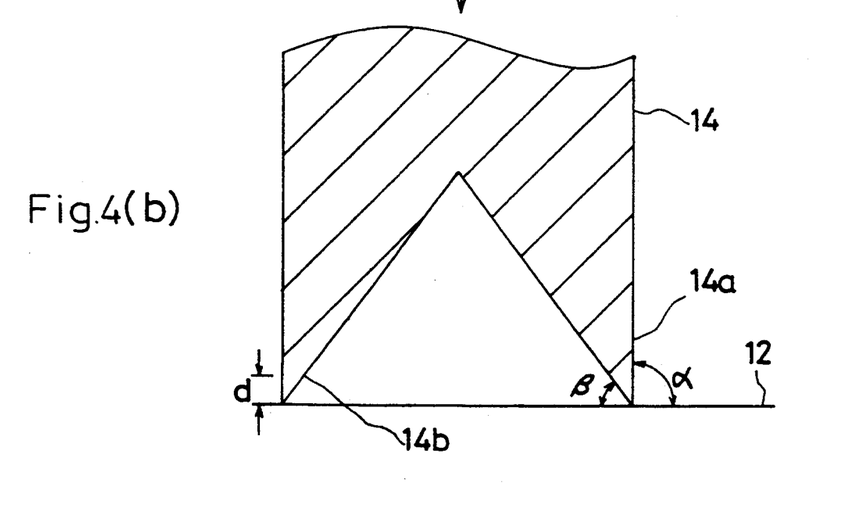

Referring to FIGS. 4a and 4b, another cutting edge 14a is described. As seen from the FIG. 4b, the bottom of the wire cutter 14 is conically recessed to form the cutting edge 14a. The residual wire 22 is pressed by the wire pressing part 14b against the board electrode 12 whereby the residual wire 22 comes to Join to the board electrode 12, for which reason an angle β formed between the inner blade side of the wire cutter 14 and the board electrode 12 should not be very great, preferably somewhere between 30° and 60°. As the angle a formed between the outer blade side of the cutter 14 and the board electrode increases, the breaking strength of the wire 13' decreases. The angle $\alpha$ must be greater than the angle $\beta$ (i.e. $\alpha > \beta$) in order to ensure that the residual wire 22 and the board electrode 12 are positively press-welded together, and that the wire 13' is positively separated from the board electrode 12 as well as from the residue wire 22.

The wire cutter 14 is made of such materials as hard metal and tungsten carbide. Since the cutting edge 14a is arranged in a circle, the wire cutter 14 is able to cut the wire 13 effectively, regardless of at which plane angle the wire 13 is connected to the board electrode 12.

Further, the present invention is available for an existing wire bonder by replacing a capillary of the existing wire bonder by the present wire cutter 14. In particular, if an existing wire bonder is an auto-bonder that is numerically controlled, the wire 13 is cut automatically under numerical control.

Referring to FIG 1c and 1d, a chip separating step of separating the semiconductor chip 18A from the board 11 is described.

In the first place, either one of the heating stage 15 to which the board 11 is secured and the chip remover 20, or both are heated in order to heat the die bonding resin 17. As a result, the adhesive strength of the die bonding resin 17 exerted between the board 11 and the defective semiconductor chip 18A becomes weak. The heating stage 15 should not be heated above the heat-resistant range of the board 11. If it is required to further weaken the adhesive strength of the resin 17, the chip remover 20 should be heated above the temperature of the heating stage 15 so as to heat the die bonding resin 17 through the semiconductor chip 18A, thereby suppressing possible damage to the board 11.

The chip remover 20 has a chip pressing part 20a which projects downward from the bottom of the chip remover 20 and which is used to force the semiconductor chip 18A sideways, a contacting surface 20b which runs parallel with the upper surface of the semiconductor chip 18A and which comes into face-to-face contact with the chip 18A when the chip remover 20 is lowered, and a space 20c, defined between the contacting surface 20b and the chip pressing part 20a, for accommodating therein the wire 13'.

With the die bonding resin 17 heated, the chip pressing part 20a forces the semiconductor chip 18A sideways, thereby exerting a horizontally-directed force (i.e. a shearing force) that acts on the underside of the semiconductor chip 18A. Due to such a shearing force, the semiconductor chip 18A is detached from the board 11. Since the wire 13' and the board electrode 12 (or the residual wire 22) are in considerably weak connection while the connection strength of the wire 13' with the chip electrode 19 remains unchanged, the wire 13' can be separated easily from the board electrode 12. Therefore, the chip remover 20 can remove the semiconductor chip 18A from the board 11 while at the same time accommodating the deformed wire 13' within its space 20c. This prevents the wire 13' from breaking when bent.

Figure 1E:
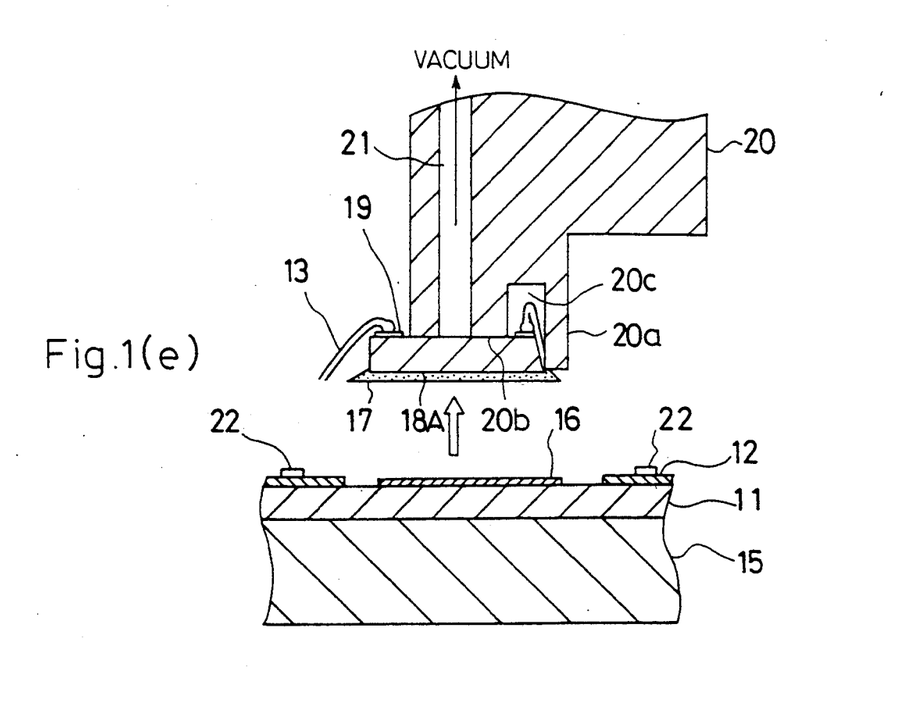

Referring to FIG. 1e, a chip removing step of removing the defective semiconductor chip 18A from the board 11 is described.

The chip remover 20 has the passage 21 for drawing vacuum which opens in the contacting surface 20b. When the chip remover 20 moves up, the defective semiconductor chip 18A stuck to the contacting surface 20b by vacuum suction is removed from the board 11.

Figure 1F:
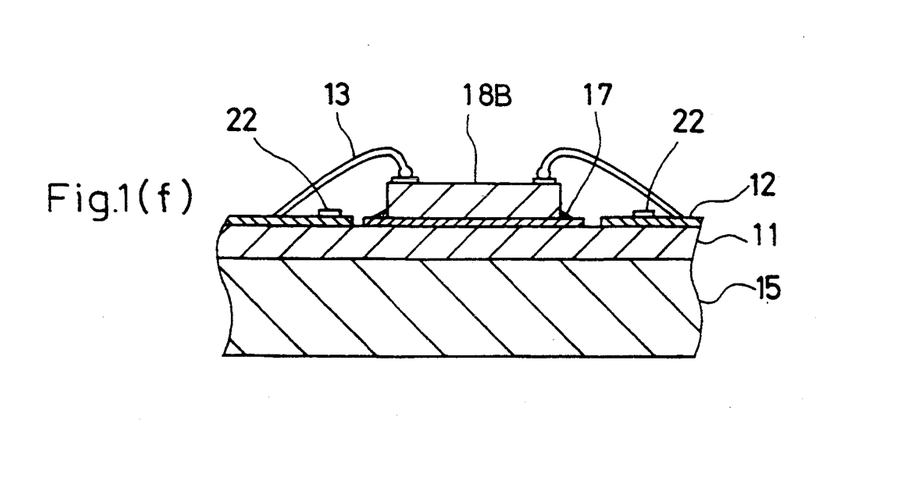

Then, as shown in FIG. 1f, the good semiconductor chip 18B is mounted onto the board 11 in position by means of a wire bonding technique to complete the required repair.

In addition to the foregoing steps, it is preferable that a wire separating step of separating the wire 13 from the board electrode 12 is carried out between the wire cutting step and the chip separating step.

Referring to FIGS. 5a to 5d, such a wire separating step is described. In this wire separation step, the wire cutter 14 moves sideways by a very small distance to completely separate the wire 13' from the board electrode 12.

Figure 5A:
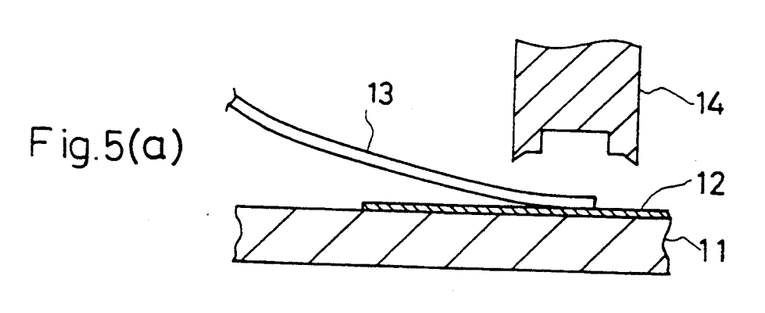
FIGS. 5a to 5d show in cross section steps of separating a bonding wire from an electrode.
Figure 5B:
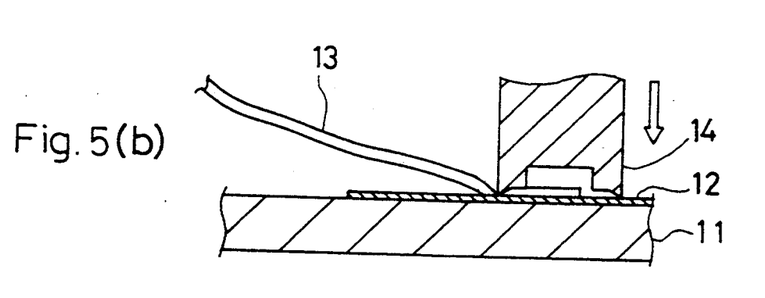
Figure 5C:
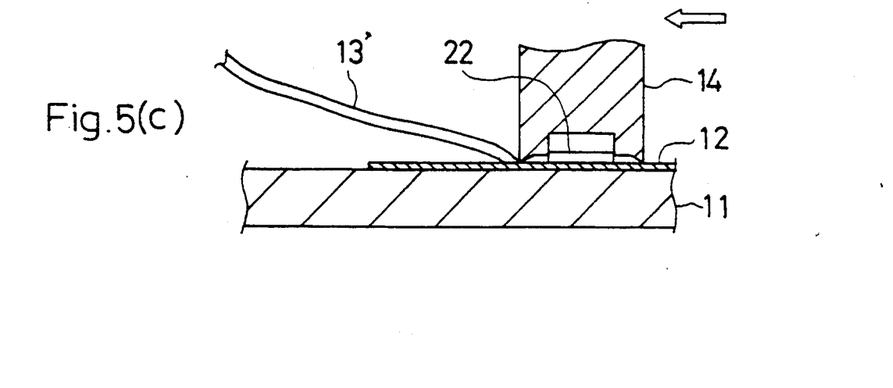
Figure 5D:
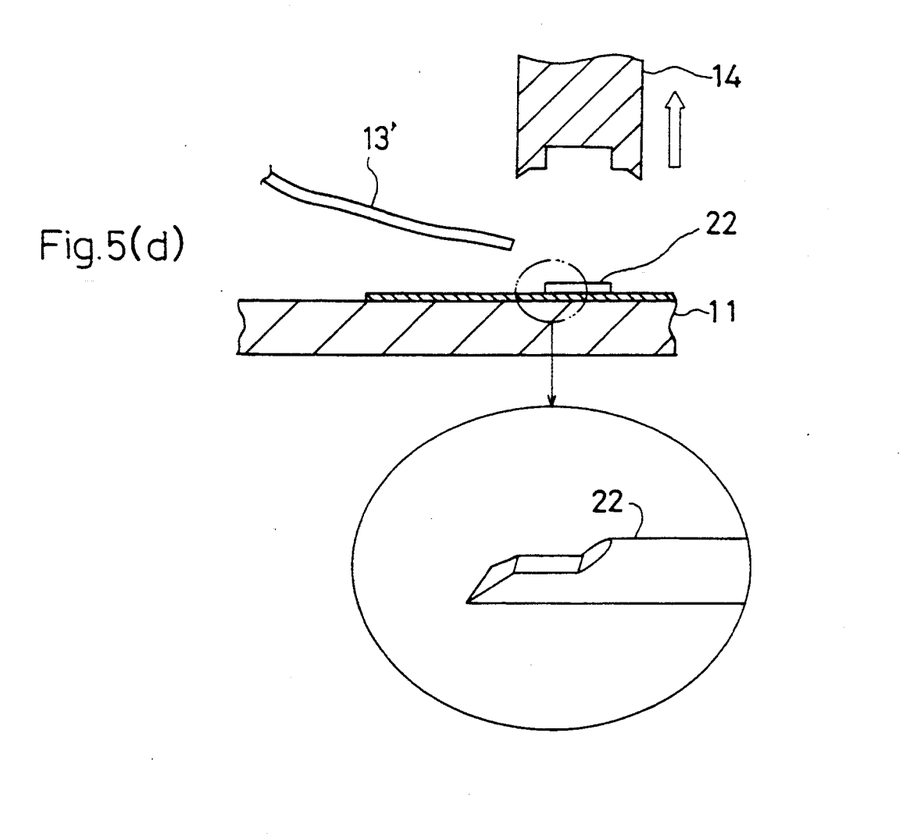

The wire cutter 14 is first lowered (see FIGS. 5a and 5b), thereafter being moved sideways in the direction of the semiconductor chip 18A (see FIG. 5c). Then, as shown in FIG. 5d, the wire cutter 14 is moved upward and the wire separating step then completes.

To complete the wire separating step, it is sufficient to make the wire cutter 14 travel sideways by about 10 to 50 $\mu$m. When the wire cutter 14 moves up, the wire 13' is still sticking to the board electrode 12 at a very slight connection strength. Such a sticking state will produce no serious problems if the number of the wires 13' is below, say, 200 or so. However, if the wire 13' count exceeds that, this requires a suction force of a few hundreds of gf to separate all of the wires 13' each in contact with the board electrode 12 at a very weak connection strength. For this reason, it is preferable to make the wire cutter 14 travel sideways after it is lowered.

The invention claimed is:

1. A semiconductor chip removal method of removing a semiconductor chip having thereon a chip electrode from a board having thereon a board electrode wherein said semiconductor chip is bonded to said board with a resin and said chip and board electrodes are connected together electrically by bonding wire, said semiconductor chip removal method comprising the steps of:

cutting said bonding wire into two pieces by a cutter that presses its cutting edge against the base of said bonding wire on said board electrode's side;

separating said bonding wire from said board electrode by forcing said cutter in the direction of said semiconductor chip, with said cutting edge against the base of said bonding wire on said board electrode's side;

separating said semiconductor chip from said board by a chip remover that forces said semiconductor chip sideways, with the adhesive strength of said resin weakened by the application of heat thereto; and removing said semiconductor chip together with one of the pieces of said bonding wire that has been left on said chip electrode's side.

2. A semiconductor chip removal method of removing a semiconductor chip having thereon a chip electrode from a board having thereon a board electrode wherein said semiconductor chip is bonded to said board with a resin and said chip and board electrodes are connected together electrically by bonding wire, said semiconductor chip removal method comprising the steps of:

cutting said bonding wire into two pieces by a cutter that presses its cutting edge arranged in a circle against the base of said bonding wire on said board electrode's side so as to cut said bonding wire into two pieces while one of the pieces of said bonding wire, left on said board electrode's side, is pressed by a wire pressing part of said cutter against said board electrode and is bonded thereto;

separating said semiconductor chip from said board by a chip remover that forces said semiconductor chip sideways, with the adhesive strength of said resin weakened by the application of heat thereto; and removing said semiconductor chip together with one of the pieces of said bonding wire that has been left on said chip electrode's side.

3. A semiconductor chip removal method of removing a semiconductor chip having thereon a chip electrode from a board having thereon a board electrode wherein said semiconductor chip is bonded to said board with a resin and said chip and board electrodes are connected together electrically by bonding wire, said semiconductor chip removal method comprising the steps of:

cutting said bonding wire into two pieces by a cutter that presses its cutting edge against the base of said bonding wire on said board electrode's side;

moving said cutting edge of said cutter towards the base of said wire on said board electrode's side by numerical control;

separating said semiconductor chip from said board by a chip remover that forces said semiconductor chip sideways, with the adhesive strength of said resin weakened by the application of heat thereto; and removing said semiconductor chip together with one of the pieces of said bonding wire that has been left on said chip electrode's side.

4. An apparatus for removing a semiconductor chip having thereon a chip electrode from a board having thereon a board electrode wherein said semiconductor chip is bonded to said board with a resin and said chip and board electrodes are connected together electrically by a bonding wire, said semiconductor chip removing apparatus comprising:

a wire cutter for cutting said wire into two pieces by pressing its cutting edge against the base of said bonding wire on said board electrode's side, said wire cutter having a cutting edge arranged in a circle and a wire pressing part inside said cutting edge for pressing a piece of said bonding wire that has been left on said board electrode's side against said board electrode to bond it thereto;

a heater for heating said board to a temperature below the heat-resistant range of said board and for serving as a platform to support said board; and a chip remover movable with respect to said board which has a chip pressing part for forcing said semiconductor chip sideways for separation and a chip holding part for holding such a separated semiconductor chip together with one of the pieces of said wire left on said chip electrode's side.

5. An apparatus for removing a semiconductor chip having thereon a chip electrode from a board having thereon a board electrode wherein said semiconductor chip is bonded to said board with a resin and said chip and board electrodes are connected together electrically by a bonding wire, said semiconductor chip removing apparatus comprising:

a wire cutter for cutting said wire into two pieces by pressing its cutting edge against the base of said bonding wire on said board electrode's side, said wire cutter having a cutting edge arranged in a circle and, at the time when said wire cutter presses said cutting edge against the base of said bonding wire on said board electrode's side, an angle formed between the outer blade side of said wire cutter and said board electrode is greater than an angle formed between the inner blade side of said wire cutter and said board electrode;

a heater for heating said board to a temperature below the heat-resistant range of said board and for serving as a platform to support said board; and a chip remover movable with respect to said board which has a chip pressing part for forcing said semiconductor chip sideways for separation and a chip holding part for holding such a separated semiconductor chip together with one of the pieces of said wire left on said chip electrode's side.

* * * * *